(12) United States Patent
Soer et al.

(10) Patent No.: US 8,289,499 B2
(45) Date of Patent: Oct. 16, 2012

(54) OPTICAL ELEMENT, LITHOGRAPHIC APPARATUS INCLUDING SUCH AN OPTICAL ELEMENT, DEVICE MANUFACTURING METHOD, AND DEVICE MANUFACTURED THEREBY

(75) Inventors: Wouter Anthon Soer, Nijmegen (NL); Maarten Marinus Johannes Wilhelmus Van Herpen, Heesch (NL)

(73) Assignee: ASML Netherlands B.V., Veldhoven (NL)

( * ) Notice: Subject to any disclaimer, the term of this patent is extended or adjusted under 35 U.S.C. 154(b) by 655 days.

(21) Appl. No.: 12/495,043

(22) Filed: Jun. 30, 2009

(65) Prior Publication Data
US 2010/0002216 A1   Jan. 7, 2010

Related U.S. Application Data

(60) Provisional application No. 61/077,048, filed on Jun. 30, 2008.

(51) Int. Cl.
*G02B 5/26*    (2006.01)
*F21V 9/08*    (2006.01)
*G03B 27/72*   (2006.01)

(52) U.S. Cl. ............ 355/71; 355/67; 359/358; 359/359; 359/361; 359/857; 378/34

(58) Field of Classification Search ............... 355/67, 355/71; 359/358, 359, 361, 857; 378/34
See application file for complete search history.

(56) References Cited

U.S. PATENT DOCUMENTS

| | | | | |
|---|---|---|---|---|
| 4,983,039 A | * | 1/1991 | Harada et al. | 356/328 |
| 5,124,859 A | * | 6/1992 | Martin et al. | 359/886 |
| 6,479,195 B1 | * | 11/2002 | Kirchauer et al. | 430/5 |
| 6,678,037 B2 | * | 1/2004 | Van Elp et al. | 355/67 |
| 6,798,495 B2 | * | 9/2004 | Nagasaka et al. | 355/67 |
| 7,196,343 B2 | * | 3/2007 | Van Herpen et al. | 250/505.1 |
| 7,196,842 B2 | * | 3/2007 | Weigl et al. | 359/361 |
| 7,250,620 B2 | * | 7/2007 | Wurm et al. | 250/504 R |
| 7,312,459 B2 | * | 12/2007 | Amemiya et al. | 250/372 |
| 7,842,438 B2 | * | 11/2010 | Constancias | 430/5 |
| 7,957,004 B2 | * | 6/2011 | Johansen et al. | 356/454 |
| 2006/0145094 A1 | * | 7/2006 | Van Herpen et al. | 250/492.2 |
| 2006/0146413 A1 | * | 7/2006 | Klunder et al. | 359/634 |
| 2006/0160031 A1 | * | 7/2006 | Wurm et al. | 430/322 |
| 2006/0245058 A1 | * | 11/2006 | Van Herpen et al. | 359/587 |
| 2008/0138013 A1 | * | 6/2008 | Parriaux | 385/37 |
| 2011/0019174 A1 | * | 1/2011 | Soer et al. | 355/71 |
| 2011/0134410 A1 | * | 6/2011 | Van Herpen et al. | 355/71 |

* cited by examiner

*Primary Examiner* — Thomas R Artman
(74) *Attorney, Agent, or Firm* — Sterne, Kessler, Goldstein & Fox P.L.L.C

(57) ABSTRACT

Spectral purity of a radiation beam of a first wavelength may be improved by providing an optical element that includes a structure having at least first layer including a first material, which structure is configured to be substantially reflective for a radiation of the first wavelength and substantially transparent or absorptive for a radiation of a second wavelength, a second layer including a second material, the second layer being configured to be substantially reflective, absorptive or scattering for the radiation of the second wavelength, and vacuum between the first layer and the second layer, wherein the first layer is located upstream in the optical path of incoming radiation with respect to the second layer.

23 Claims, 6 Drawing Sheets

OPTICAL ELEMENT, LITHOGRAPHIC APPARATUS INCLUDING SUCH AN OPTICAL ELEMENT, DEVICE MANUFACTURING METHOD, AND DEVICE MANUFACTURED THEREBY

CROSS-REFERENCE TO RELATED APPLICATIONS

The present application claims the benefit under 35 U.S.C §119(e) of U.S. Provisional Patent Application No. 61/077,048, filed Jun. 30, 2008, which is incorporated herein by reference in its entirety.

BACKGROUND

1. Field

Embodiments of the present invention relate to an optical element and lithographic apparatus including such an optical element, a method for manufacturing a device, and device manufactured thereby. More specifically, the optical element may be used as a reflective grazing-incidence spectral purity filter for Laser Produced Plasma (LPP) Extreme Ultraviolet (EUV) sources.

2. Background

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

When using an LPP source, the laser radiation itself represents a significant amount of unwanted radiation that is emitted into the EUV lithography tool by scattering and reflection at the plasma. Typically, a $CO_2$ laser having a wavelength of around 10.6 µm is used. Since the optics of the EUV lithographic system have a high reflectivity at 10.6 µm, the laser radiation propagates into the lithography tool with significant power. Part of this power is eventually absorbed by the wafer causing unwanted heating of the wafer.

U.S. Pat. No. 7,196,343 B2 discloses a reflective grazing-incidence spectral purity filter (SPF) for filtering deep ultraviolet (DUV) radiation. This SPF includes two perpendicular mirrors with an antireflection (AR) coating for DUV radiation of one polarization. By using two perpendicular reflections, the (mostly unpolarized) DUV radiation is effectively suppressed by absorption in the substrate. Furthermore, the AR coating is characterized in that it has a high reflectivity for EUV, so that EUV radiation is mostly reflected.

This spectral purity filter is not suited for suppressing 10.6 µm radiation in an LPP source for mainly two reasons: AR coatings for 10.6 µm generally have a very low reflectivity for EUV; and conventional mirror substrates reflect rather than absorb 10.6 µm radiation.

SUMMARY

Embodiments of the invention may improve the spectral purity by providing an optical element that includes a structure including at least first layer including a first material, which structure is configured to be substantially reflective for EUV radiation and substantially transparent or absorptive for a $CO_2$ or yttrium aluminum garnet (YAG) laser radiation, a second layer including a second material, the second layer being configured to be substantially reflective, absorptive or scattering for the radiation of the $CO_2$ or the YAG laser radiation, and vacuum between the first layer and the second layer, wherein the first layer is located upstream in the optical path of incoming radiation with respect to the second layer in order to improve spectral purity of the EUV radiation.

According to an aspect of the invention, there is provided a lithographic apparatus including: an illumination system configured to condition a radiation beam; a patterning device configured to pattern the radiation beam; a support configured to hold a substrate; and a projection system configured to project the patterned radiation beam onto a target portion of the substrate, wherein the illumination system and/or the projection system includes an optical element that includes a structure including at least a first layer including a first material, which structure is configured to be substantially reflective for EUV radiation and substantially transparent or absorptive for a $CO_2$ or yttrium aluminum garnet (YAG) laser radiation, a second layer including a second material, the second layer being configured to be substantially reflective, absorptive or scattering for the radiation of the $CO_2$ or the YAG laser radiation, and vacuum between the first layer and the second layer, wherein the first layer is located upstream in the optical path of incoming radiation with respect to the second layer in order to improve spectral purity of the EUV radiation.

According to an aspect of the invention, there is provided a device manufacturing method including: patterning a radiation beam to form a patterned radiation beam; projecting the patterned radiation beam onto a substrate; and reflecting the radiation beam with at least one optical element that includes a structure including at least a first layer including a first material, which structure is configured to be substantially reflective for EUV radiation and substantially transparent or absorptive for a $CO_2$ or yttrium aluminum garnet (YAG) laser radiation, a second layer including a second material, the second layer being configured to be substantially reflective, absorptive or scattering for the radiation of the $CO_2$ or the YAG laser radiation, and vacuum between the first layer and the second layer, wherein the first layer is located upstream in the optical path of incoming radiation with respect to the second layer in order to improve spectral purity of the EUV radiation.

According to an aspect of the invention, there is provided a device manufactured according to the method of: patterning a radiation beam to form a patterned radiation beam; projecting the patterned radiation beam onto a substrate; and reflecting the radiation beam with at least one optical element that includes a structure including at least a first layer including a first material, which structure is configured to be substantially reflective for EUV radiation and substantially transparent or absorptive for a $CO_2$ or yttrium aluminum garnet (YAG) laser radiation, a second layer including a second material, the second layer being configured to be substantially reflective, absorptive or scattering for the radiation of the $CO_2$ or the YAG laser radiation, and vacuum between the first layer and the second layer, wherein the first layer is located upstream in the optical path of incoming radiation with respect to the second layer in order to improve spectral purity of the EUV radiation.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Figure 1:
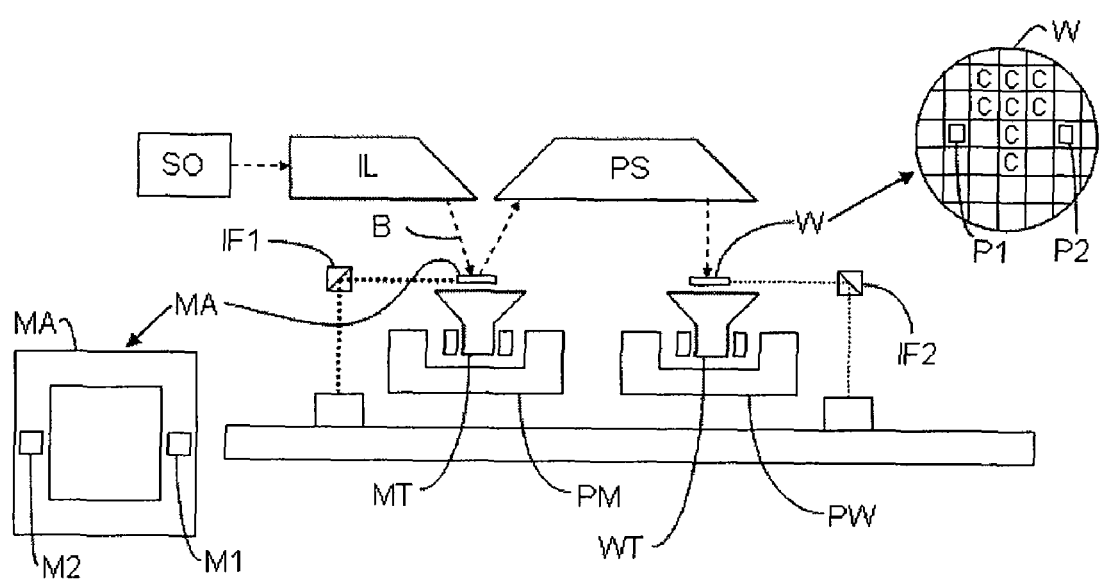
FIG. 1 depicts a lithographic apparatus according to an embodiment of the invention.

FIG. 1 schematically depicts a lithographic apparatus according to one embodiment of the invention. The apparatus includes: an illumination system (illuminator) IL configured to condition a radiation beam B (e.g. UV radiation, DUV radiation, EUV radiation or radiation with even smaller wavelength than EUV radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as desired. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix. The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate.

An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from source SO to illuminator IL with the aid of a beam delivery system including, for example, suitable directing mirrors and/or a beam expander. In other cases the source may be an integral part of the lithographic apparatus, for example when the source is a mercury lamp. Source SO and illuminator IL, together with the beam delivery system if desired, may be referred to as a radiation system.

Illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, illuminator IL may include various other components, such as an integrator and a condenser. The illuminator may be used to condition the radiation beam, to have a desired uniformity and intensity distribution in its cross-section.

Radiation beam B is incident on the patterning device (e.g., mask MA), which is held on the support structure (e.g., mask table MT), and is patterned by the patterning device. Having traversed mask MA, radiation beam B passes through projection system PS, which focuses the beam onto a target portion C of substrate W. With the aid of second positioner PW and position sensor IF2 (e.g. an interferometric device, linear encoder or capacitive sensor), substrate table WT can be moved accurately, e.g. so as to position different target portions C in the path of radiation beam B. Similarly, first positioner PM and another position sensor IF1 can be used to accurately position mask MA with respect to the path of radiation beam B, e.g. after mechanical retrieval from a mask library, or during a scan. In general, movement of mask table MT may be realized with the aid of a long-stroke module (coarse positioning) and a short-stroke module (fine positioning), which form part of first positioner PM. Similarly, movement of substrate table WT may be realized using a long-stroke module and a short-stroke module, which form part of second positioner PW. In the case of a stepper (as opposed to a scanner) mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on mask MA, the mask alignment marks may be located between the dies.

The depicted apparatus could be used in at least one of the following modes:

1. In step mode, mask table MT and substrate table WT are kept essentially stationary, while an entire pattern imparted to the radiation beam is projected onto a target portion C at one time (i.e. a single static exposure). Substrate table WT is then shifted in the X and/or Y direction so that a different target portion C can be exposed. In step mode, the maximum size of the exposure field limits the size of the target portion C imaged in a single static exposure.

2. In scan mode, mask table MT and substrate table WT are scanned synchronously while a pattern imparted to the radiation beam is projected onto a target portion C (i.e. a single dynamic exposure). The velocity and direction of substrate table WT relative to mask table MT may be determined by the (de-)magnification and image reversal characteristics of projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, mask table MT is kept essentially stationary holding a programmable patterning device, and substrate table WT is moved or scanned while a pattern imparted to the radiation beam is projected onto a target portion C. In this mode, generally a pulsed radiation source is employed and the programmable patterning device is updated as desired after each movement of substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
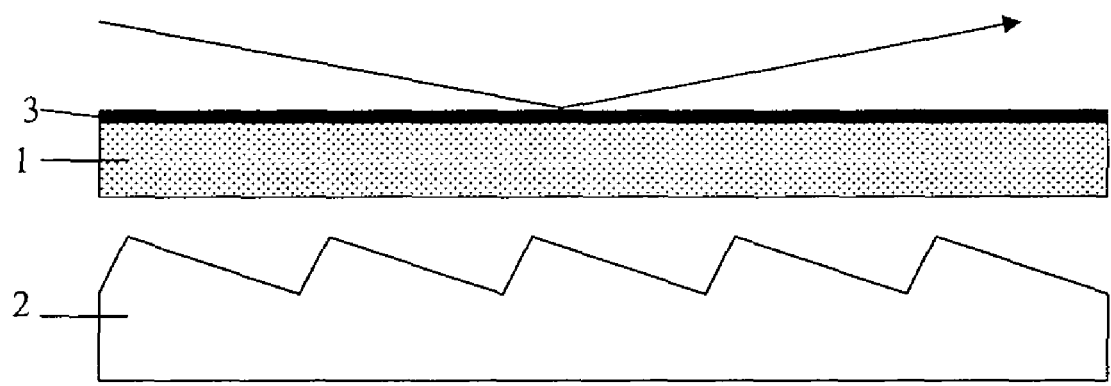
FIG. 2 depicts an optical element according to an embodiment of the invention.

FIG. 2 shows an optical element according to an embodiment of the invention, including a first layer 1 with an EUV reflective cap layer 3, and an infrared receiving second layer 2. Although the following description refers to radiation having a wavelength of 10.6 μm, one of skill in the art will recognize that other embodiments of the systems and methods disclosed herein may utilize radiation of a different wavelength.

First layer 1 may be made of a material that is transparent to 10.6 μm radiation, for example ZnSe, ZnS, GaAs or Ge. The first layer may form a layer or a structure of a so-called etalon, which is a transparent plate with two reflecting parallel surfaces. It should be noted that the word etalon is sometimes used to describe a Fabry-Perot interferometer, which may include two closely spaced partially silvered surfaces.

The complex amplitude reflectivity of an etalon may be given by:

$$r = -\frac{r_1 - e^{-i\delta}}{1 - r_1 e^{-i\delta}}$$

where r1 is the complex amplitude reflectivity of the first surface, and $$\delta = \frac{4\pi}{\lambda} nt \cos\theta_t$$

where n is the index of refraction of the plate, t is the thickness of the plate, $\theta_t$ is the angle of refraction the light makes within the plate, and λ is the wavelength of the light in vacuum.

Figure 3:
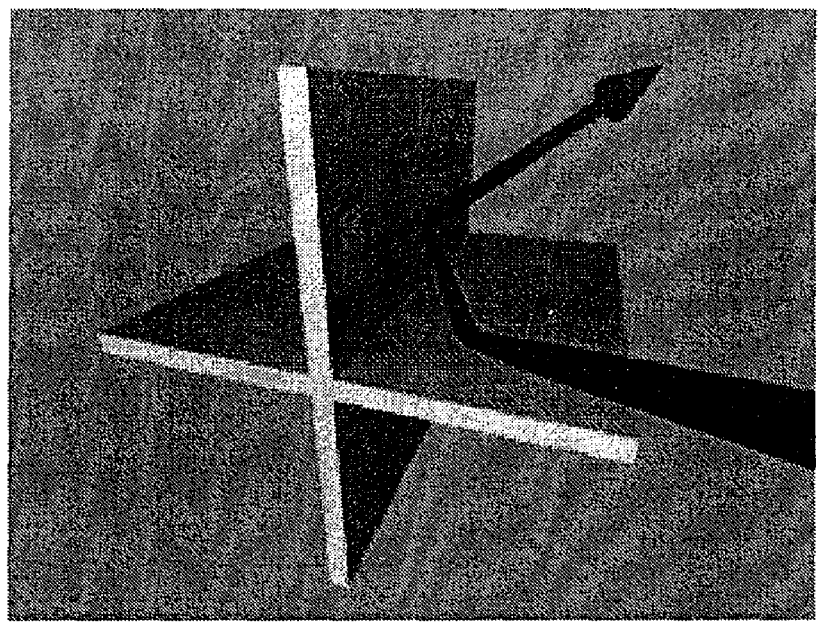
FIG. 3 depicts an optical element according to an embodiment of the invention.

Cap layer 3 has a high reflectivity for EUV, for which typically a thickness of the order of 10 nm is required. Since metals will generally reflect 10.6 μm radiation even when applied as a very thin layer, cap layer 3 is preferably made of a non-metallic material, for example diamond-like carbon (DLC) or $TiO_2$. The thickness of this layer may be tuned for EUV reflectivity and optimum DUV suppression in the desired wavelength range. The total thickness of first layer 1 and cap layer 3 may be tuned such that p-polarized infrared radiation is minimally reflected and maximally transmitted throughout the range of incidence angles. Because of the polarization dependence, two perpendicular reflections are needed; this may be implemented at intermediate focus as shown in FIG. 3.

First layer 1 may be configured to be transparent to radiation of a wavelength of 10.6 µm, and third layer 3 (EUV reflective capping layer) may have a thickness such that it functions as an antireflection coating for DUV radiation. Thus, the optical element may combine suppression of two kinds of radiation, namely radiation with a wavelength of 10.6 µm and DUV radiation: radiation with a wavelength of 10.6 µm incident on the optical element may propagate through third layer 3 and first layer 1, and be absorbed by second layer 2; and DUV radiation may be suppressed by third layer 3, which acts as an antireflection coating for the DUV radiation.

Infrared receiving second layer 2 may be designed to absorb the infrared radiation, reflect it outside an etendue or scatter it outside the etendue, or reflect and scatter it outside the etendue. In either case, the surface of the second layer may be inclined from the first layer. The etendue is associated with the optical path traversed by radiation beam B in FIG. 1. In the case of absorption, an inclined surface may be used because even infrared-absorbing materials such as glasses (e.g. fused silica) or ceramics (e.g. $TiO_2$) become substantially reflective for the very small incidence angles used. In the case of reflection, an inclined surface is needed to reflect the infrared radiation in a different direction than the EUV radiation.

Figure 4:
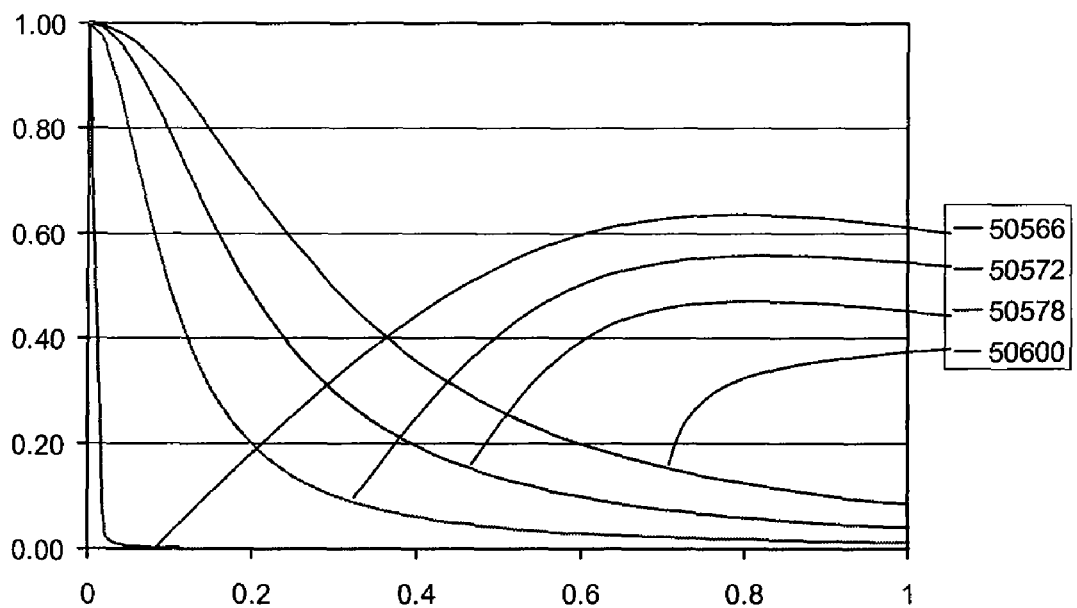
FIG. 4 depicts reflectivity of the optical element of FIG. 3 for radiation.
Figure 4:
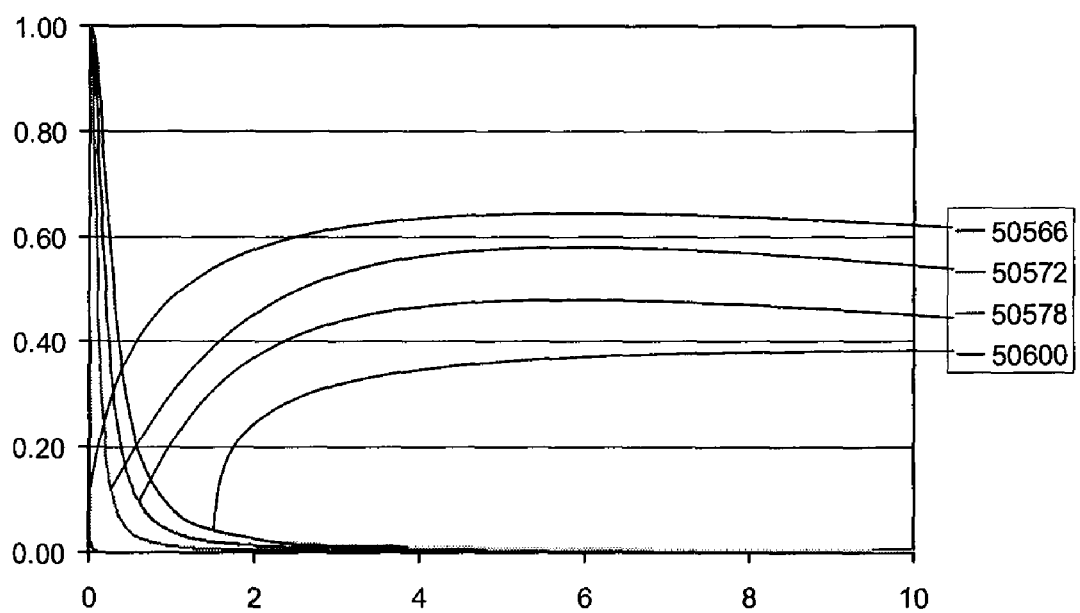
Figure 5:
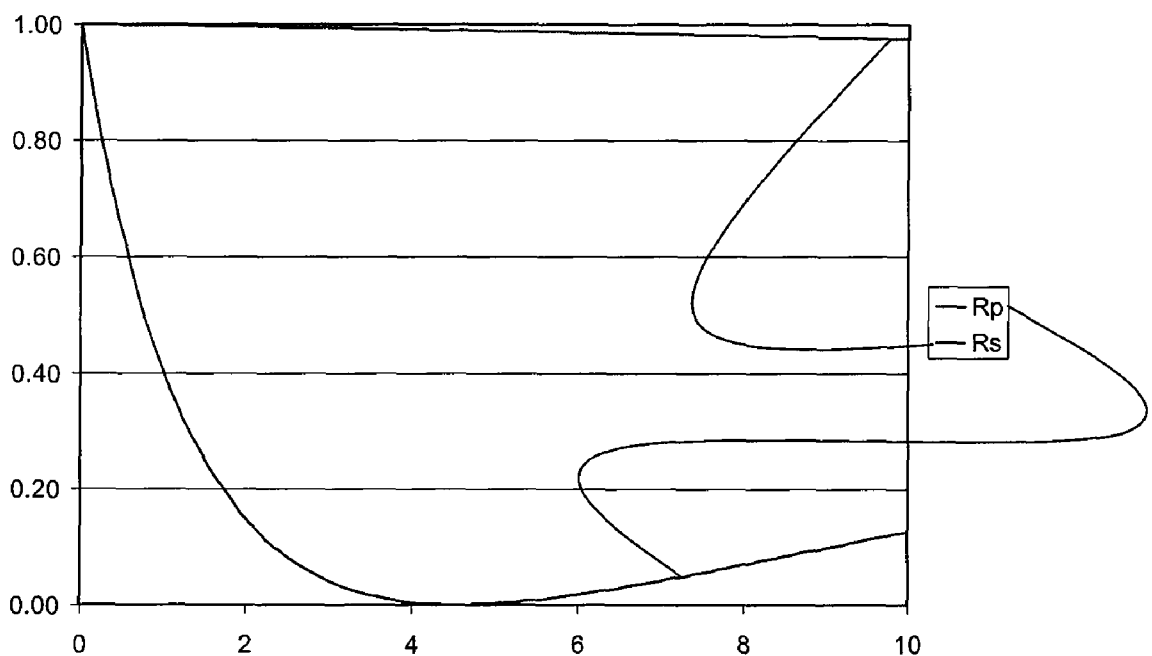
FIG. 5 depicts reflectivity of the optical element of FIG. 3.

As an example, an embodiment includes a Ge etalon of 50566 nm thickness with a DLC cap layer of 20 nm thickness. Here, the thickness of the etalon has been chosen to be around 50 µm to give reasonable mechanical stability to the etalon. However, since the behavior of the etalon is periodic with a period of about 1.35 µm, the thickness can be made much smaller or larger by changing it by an integral number of periods. FIG. 4 shows the reflectivity for p-polarized 10.6 µm radiation in this embodiment. The reflectivity is less than 1% for all angles between 0.04° and 10°. This is a substantial improvement compared to the prior art SPF with an antireflection coating (see FIG. 5), which has a low reflectivity for only a small range of angles (less than 1% between 3.8° and 5.5°). The horizontal axis in FIG. 5 shows the incidence angle. Along the vertical axis is plotted the reflectivity.

In another embodiment, two mirrors are laid out in a cross shape at intermediate focus, or another focus point in the lithography tool as shown in FIG. 3. The structure shown in FIG. 2 is applied on both sides of each mirror. The advantage of this embodiment is that the range of incidence angles is smaller and therefore the average reflectivity is higher. The total reflectivity of the two mirrors is obtained by integrating the average reflectivity $[Rp(\theta)Rs(\phi)+Rs(\theta)Rp(\phi)]/2$ over the appropriate range of incidence angles. Under a certain condition, the total reflectivity is 85.1% at 13.5 nm and 0.06% at 10.6 µm, i.e. the total spectral purity is increased by a factor of >1000. The reflectivity in the DUV range varies between 10% and 40% and can be tuned by changing the thickness of the DLC layer.

It should be noted that the infrared reflectivity of the etalon is very sensitive to changes in its thickness, and to changes in the infrared wavelength to be suppressed. This is illustrated in FIG. 4 by the reflectivity of embodiments in which the etalon thickness is 50572 nm, 50578 nm and 50600 nm, respectively, instead of 50566 nm. This reflectivity is plotted along the vertical axis. In the horizontal axis is plotted the incidence angle. When the thickness of the etalon is 50600 nm instead of 50566 nm, the total reflectivity at 10.6 µm becomes 3.0%, i.e. the spectral purity is still increased by a factor of 28.5. Thus, the thickness must be controlled within +/−30-40 nm to achieve good infrared suppression. Likewise, the infrared wavelength may be kept within a similar bandwidth to achieve good suppression.

Note that contamination (for example carbon) on the SPF will change the thickness of the etalon. Therefore, cleaning strategies similar to those for EUV mirrors may be needed. However, since the contamination tolerance for the etalon is relatively large, this is not expected to be a problem.

Figure 6:
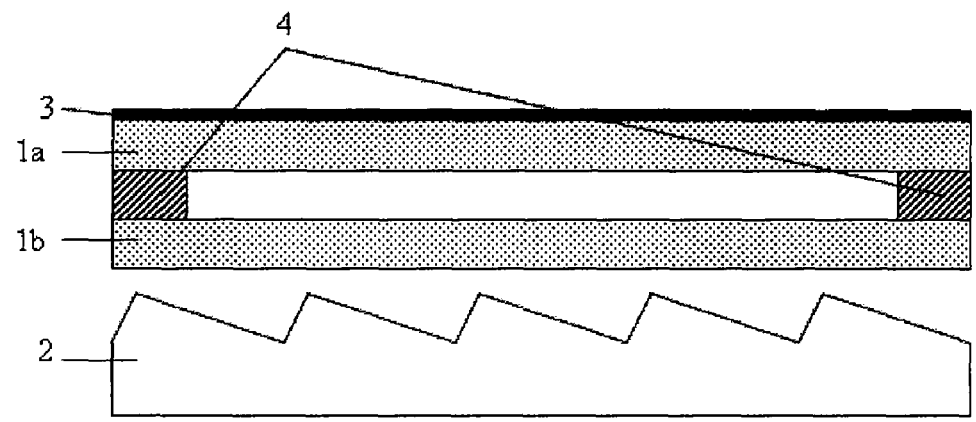
FIG. 6 depicts an optical element according to an embodiment of the invention.

In a further embodiment, first layer 1 may not be implemented as a single slab of material with highly parallel surfaces (i.e. an etalon), but as a Fabry-Perot interferometer including two slabs of material that can be moved relative to one another. This embodiment is shown in FIG. 6 and includes two plates 1a and 1b and at least one actuator 4 for moving these slabs relative to one another, for example, piezo actuators for changing the distance and/or angle between the plates, or rotation means to rotate one plate relative to the other.

In this embodiment, imperfections in the plate thickness may be compensated by the actuators. For example, if the reflective surfaces of the plates are not exactly parallel (the plates may be wedged in order to prevent extra unwanted etalon effects), the plates may be rotated or tilted such that a surface of one plate is aligned with a surface of the other plate. Moreover, if the thickness of the plates is not optimal (for example due to contamination build-up), this may be compensated by changing the distance between the plates.

In another embodiment, first layer 1 may not be separated from infrared receiving second layer 2 by vacuum, but by another material that has a refractive index close to 1 for 10.6 µm radiation. This makes the SPF more robust since there are no freestanding layers that are easily damaged.

Figure 7:
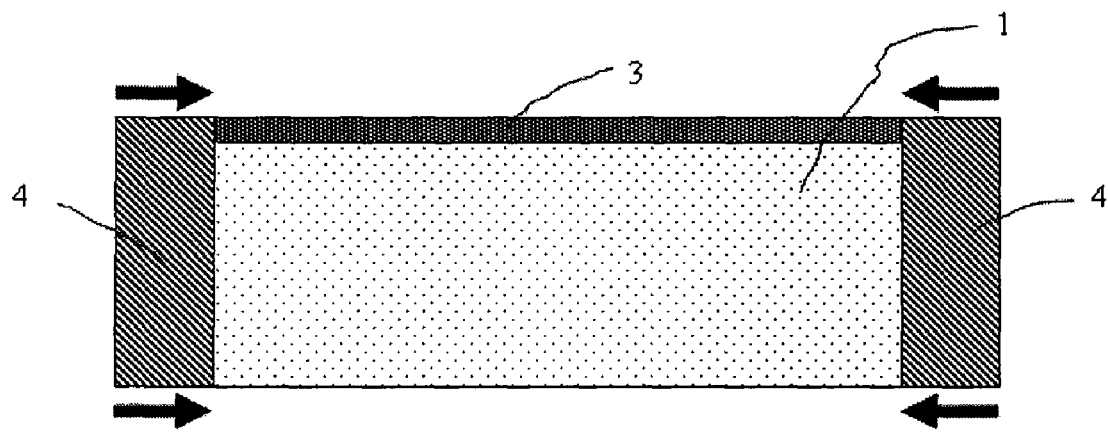
FIG. 7 depicts an optical element according to an embodiment of the invention.

In a further embodiment, the thickness of first layer 1 is controlled by compressing it with piezo elements, as shown in FIG. 7. By compressing first layer 1 from its sides, the thickness of first layer 1 will increase slightly. Since the thickness only needs to be adjusted with a few nanometers, this slight increase suffices.

Figure 8:
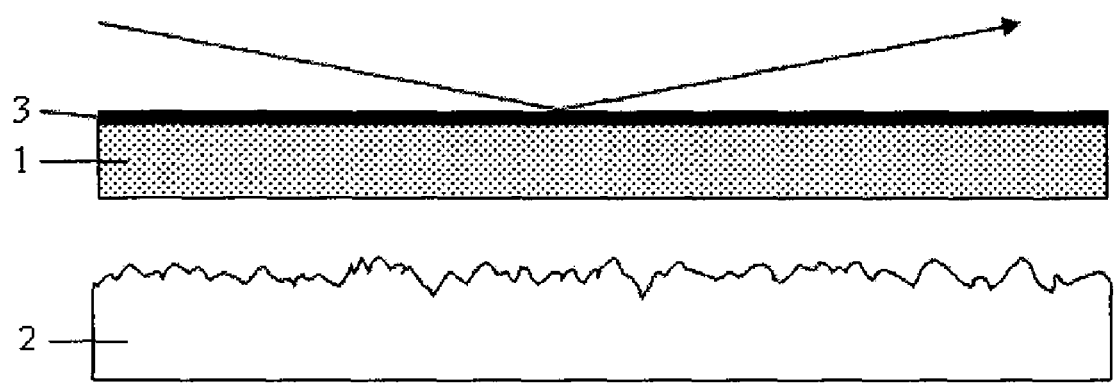
FIG. 8 depicts an optical element according to an embodiment of the invention.

In another embodiment the surface of second layer 2 is patterned to scatter the infrared radiation, as schematically shown in FIG. 8.

In this embodiment scattered infrared radiation is directed outside the EUV beam after transmission through the mirror.

In yet a further embodiment, the surface of second layer 2 is not patterned or rough, but continuously inclined with respect to the EUV reflective surface. In this embodiment, a substantial inclination angle (e.g. 5°) is needed to diffract the radiation outside the EUV beam. This will produce a relatively thick mirror, which results in an undesirable increase of etendue if the mirrors are double-sided and placed at IF as shown in FIG. 3. Therefore the inclined surface may be broken up in several steps, resulting in a sawtooth pattern as illustrated in FIG. 2.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below. It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An optical element comprising:
a structure comprising a first layer comprising a first material, which structure is configured to be substantially reflective for radiation of a first wavelength and at least partially transparent for radiation of a second wavelength;
a second layer comprising a second material, the second layer being configured to be substantially reflective, absorptive or scattering for radiation of the second wavelength, wherein a surface of the second layer is inclined with respect to the first layer; and
a vacuum or gas between the first layer and the second layer,
wherein the first layer is located upstream in an optical path of incoming radiation with respect to the second layer in order to improve spectral purity of the radiation of the first wavelength.

2. An optical element according to claim 1, wherein the structure is configured to reflect the radiation of the first wavelength to a first direction, the second layer is configured to reflect the radiation of the second wavelength to a second direction, the first direction and the second direction being substantially different from each other.

3. An optical element according to claim 1, wherein a thickness of the structure is adaptable.

4. An optical element according to claim 1, wherein the first material comprises at least one material selected from the group consisting of ZnSe, ZnS, GaAs, Ge, diamond, and diamond-like carbon.

5. An optical element according to claim 1, wherein the second material comprises at least one material selected from the group consisting of fused silica, $TiO_2$, and any other glass or ceramic material.

6. An optical element according to claim 1, wherein the structure further comprises a third layer on top of the first layer, which third layer comprises a third material and is configured to be substantially reflective for radiation of the first wavelength and at least partially transparent for radiation of the second wavelength.

7. An optical element according to claim 6, wherein the third material comprises at least one material selected from the group consisting of diamond-like carbon and TiO2.

8. An optical element according to claim 6, wherein a thickness of the third layer is between 1 and 20 nm.

9. An optical element according to claim 1, wherein the radiation of the first wavelength is EUV radiation.

10. An optical element according to claim 1, wherein the radiation of the second wavelength is infrared radiation.

11. An optical device comprising at least two optical elements according to claim 1.

12. An optical device according to claim 11, wherein the reflecting surfaces of at least two of the optical elements are oriented transversely with respect to each other.

13. An optical device according to claim 12, wherein the reflecting surfaces are oriented substantially perpendicularly with respect to each other.

14. An optical device according to claim 12, wherein the optical elements have a substrate made of Si or Cu.

15. A lithographic apparatus comprising at least one optical element according to claim 1.

16. A lithographic apparatus according to claim 15, wherein the lithographic apparatus further comprises:
- an illumination system configured to condition a radiation beam;
- a patterning device configured to pattern the radiation beam;
- a support configured to hold a substrate; and
- a projection system configured to project the patterned radiation beam onto a target portion of the substrate.

17. A lithographic apparatus comprising at least two optical elements according to claim 1, wherein the reflecting surfaces of the respective optical elements are oriented substantially perpendicular with respect to each other.

18. An optical element comprising:
- a structure comprising a first layer comprising a first material, which structure is configured to be substantially reflective for radiation of a first wavelength and at least partially transparent for radiation of a second wavelength;
- a second layer comprising a second material, the second layer being configured to be substantially reflective, absorptive or scattering for radiation of the second wavelength; and
- a vacuum or gas between the first layer and the second layer,
- wherein the first layer is located upstream in an optical path of incoming radiation with respect to the second layer in order to improve spectral purity of the radiation of the first wavelength and wherein the second layer has a surface roughness with a length scale of about the order of the second wavelength.

19. A device manufacturing method comprising:
- patterning a radiation beam to form a patterned radiation beam;
- projecting the patterned radiation beam onto a substrate; and
- reflecting the radiation beam with at least one optical element comprising:
  - a structure comprising at least a first layer comprising a first material, which structure is configured to be substantially reflective for radiation of a first wavelength and at least partially transparent for radiation of a second wavelength;
  - a second layer comprising a second material, the second layer being configured to be substantially reflective, absorptive or scattering for a radiation of the second wavelength; and
  - a vacuum or gas between the first layer and the second layer,
  - wherein the first layer being is located upstream in an optical path of incoming radiation with respect to the second layer in order to improve spectral purity of the radiation of the first wavelength.

20. A device manufacturing method according to claim 19, wherein the structure is configured to reflect the radiation of the first wavelength to a first direction, the second layer is configured to reflect the radiation of the second wavelength to a second direction, and the first direction and the second direction are substantially different from each other.

21. An optical device comprising:
- at least two optical elements, wherein each of the at least two optical elements comprises:
  - a structure, having a first layer of a first material configured to be substantially reflective for radiation of a first wavelength and at least partially transparent for radiation of a second wavelength;
  - a second layer, having a second material, configured to be substantially reflective, absorptive or scattering for radiation of the second wavelength; and
  - a vacuum or gas between the first layer and the second layer,
  - wherein the first layer is located upstream in an optical path of incoming radiation with respect to the second layer in order to improve spectral purity of the radiation of the first wavelength, and
- wherein the reflecting surfaces of the at least two optical elements are oriented transversely with respect to each other.

22. A lithographic apparatus comprising an optical device according to claim 21.

23. A lithographic apparatus comprising:
- an illumination system configured to condition a radiation beam;
- a patterning device configured to pattern the radiation beam;
- a support configured to hold a substrate;
- a projection system configured to project the patterned radiation beam onto a target portion of the substrate; and
- an optical element comprising:
  - a structure, having a first layer of a first material configured to be substantially reflective for radiation of a first wavelength and at least partially transparent for radiation of a second wavelength;
  - a second layer, having a second material, configured to be substantially reflective, absorptive or scattering for radiation of the second wavelength; and
  - a vacuum or gas between the first layer and the second layer,
  - wherein, the first layer is located upstream in an optical path of incoming radiation with respect to the second layer in order to improve spectral purity of the radiation of the first wavelength.

* * * * *

UNITED STATES PATENT AND TRADEMARK OFFICE
CERTIFICATE OF CORRECTION

| | |
|---|---|
| PATENT NO. | : 8,289,499 B2 |
| APPLICATION NO. | : 12/495043 |
| DATED | : October 16, 2012 |
| INVENTOR(S) | : Soer et al. |

It is certified that error appears in the above-identified patent and that said Letters Patent is hereby corrected as shown below:

In claim 19, col. 12, line 3, after "layer" please delete "being".

Signed and Sealed this
Fifth Day of February, 2013

Teresa Stanek Rea
*Acting Director of the United States Patent and Trademark Office*